(12) United States Patent
Lee

(10) Patent No.: US 7,777,342 B2
(45) Date of Patent: Aug. 17, 2010

(54) SEMICONDUCTOR DEVICE AND METHOD FOR MANUFACTURING THE SAME

(75) Inventor: Ki Min Lee, Chungbuk (KR)

(73) Assignee: Dongbu HiTek Co., Ltd, Seoul (KR)

( * ) Notice: Subject to any disclaimer, the term of this patent is extended or adjusted under 35 U.S.C. 154(b) by 0 days.

(21) Appl. No.: 12/500,426

(22) Filed: Jul. 9, 2009

(65) Prior Publication Data

US 2009/0273090 A1  Nov. 5, 2009

Related U.S. Application Data

(63) Continuation of application No. 11/564,175, filed on Nov. 28, 2006, now Pat. No. 7,575,996.

(30) Foreign Application Priority Data

Nov. 30, 2005 (KR) .................. 10-2005-0115444

(51) Int. Cl.
   *H01L 23/48* (2006.01)
(52) U.S. Cl. ............ 257/758; 257/775; 257/E23.145
(58) Field of Classification Search ......... 257/758–760, 257/774–775, E23.145
   See application file for complete search history.

(56) References Cited

U.S. PATENT DOCUMENTS

| 6,265,321 B1 * | 7/2001 | Chooi et al. .............. 438/725 |
| 2005/0230836 A1 | 10/2005 | Clarke et al. |
| 2006/0022224 A1 * | 2/2006 | Hiroi .......................... 257/226 |

* cited by examiner

*Primary Examiner*—Thanhha Pham
(74) *Attorney, Agent, or Firm*—Sherr & Vaughn, PLLC

(57) ABSTRACT

Embodiments relate to a semiconductor device and a method for manufacturing the same. Embodiments may include forming a lower porous oxide layer on a semiconductor substrate having a conductive layer, forming a pyrolytic polymer layer on the lower porous oxide layer, forming an upper porous oxide layer on the pyrolytic polymer layer, forming a via hole by sequentially etching the upper porous oxide layer, the pyrolytic polymer layer, and the lower porous oxide layer, forming a trench having a width larger than a width of the via hole by sequentially etching the upper porous oxide layer and the pyrolytic polymer layer in such a manner that the trench is connected with the via hole, forming metal interconnections by filling the via hole and the trench with a metal thin film, and forming a vacuum between the upper and lower porous oxide layers by removing the pyrolytic polymer layer.

14 Claims, 6 Drawing Sheets

SEMICONDUCTOR DEVICE AND METHOD FOR MANUFACTURING THE SAME

The present application is a Continuation Application of a U.S. patent application Ser. No. 11/564,175 filed on Nov. 28, 2006, now U.S. Pat. No. 7,575,996 which claims priority under 35 U.S.C. 119 and 35 U.S.C. 365 to Korean Patent Application No. 10-0115444 (filed on Nov. 30, 2005), which is hereby incorporated by reference in its entirety.

BACKGROUND

Embodiments relate to a semiconductor device and a method for manufacturing the same.

A metal interconnection of a semiconductor device may be formed by using a metallic thin film including, for example, aluminum (Al) or copper (Cu), etc. The metal interconnection may connect circuits formed in a semiconductor substrate through electric connection and pad connection between semiconductor devices.

To form the metal interconnection, a contact hole may be formed by selectively etching an insulating layer. A device electrode may be connected with a pad, which may be insulated from the device electrode by an insulating layer including an oxide layer, through a contact hole that may be formed by selectively etching the insulating layer. A metal plug including a barrier metal or tungsten may be used to fill in the contact hole. In addition, a metal thin film may be formed on the resultant structure. The metal thin film may then be patterned, thereby forming the metal interconnection that connects the device electrode with the pad.

A photolithography process may be commonly used to form a pattern in the metal interconnection. However, as semiconductor devices have become smaller, a CD (critical dimension) of the metal interconnection has been reduced, which may make it difficult to form the metal interconnection having a micro-pattern. To fabricate the metal interconnection having a micro-pattern, a damascene process may be used. A plurality of metal interconnections may be fabricated in a multi-layer structure through the damascene process.

However, in a device having a multi-layer metal interconnection structure, parasitic capacitance may exist between a lower metal interconnection and an upper metal interconnection, or between adjacent metal interconnections. This may lower an operational speed of a semiconductor device.

For this reason, an insulating layer, which may include a material having a low dielectric constant (low-k), may surround the metal interconnection and may reduce the parasitic capacitance.

However, to effectively reduce the parasitic capacitance, it may be necessary to use an insulating layer having a dielectric constant (k) corresponding to vacuum permittivity.

SUMMARY

In embodiments, an operational speed of a semiconductor device may be improved by using an inter-metal dielectric layer having a dielectric constant (k) corresponding to vacuum permittivity.

In embodiments, a semiconductor device may include a lower porous oxide layer including a via hole, formed on a semiconductor substrate having a conductive layer. The semiconductor device may further include an upper porous oxide layer including a trench connected with the via hole and being formed on the lower porous oxide layer by interposing an air layer therebetween. The semiconductor device may further include metal interconnections formed in the via hole and the trench, respectively.

In embodiments, a method for manufacturing a semiconductor device may include forming a lower porous oxide layer on a semiconductor substrate having a conductive layer, forming a pyrolytic polymer layer on the lower porous oxide layer, forming an upper porous oxide layer on the pyrolytic polymer layer, forming a via hole by sequentially etching the upper porous oxide layer, the pyrolytic polymer layer, and the lower porous oxide layer, forming a trench having a width larger than a width of the via hole by sequentially etching the upper porous oxide layer and the pyrolytic polymer layer in such a manner that the trench is connected with the via hole, forming metal interconnections by filling the via hole and the trench with a metal thin film, and forming a vacuum between the upper and lower porous oxide layers by removing the pyrolytic polymer layer.

In embodiments, a method for manufacturing a semiconductor device may include forming a lower porous oxide layer on a semiconductor substrate having a conductive layer, forming a pyrolytic polymer layer on the lower porous oxide layer, forming an upper porous oxide layer on the pyrolytic polymer layer, forming a via hole by sequentially etching the upper porous oxide layer, the pyrolytic polymer layer, and the lower porous oxide layer, forming a trench having a width larger than a width of the via hole by sequentially etching the upper porous oxide layer and the pyrolytic polymer layer in such a manner that the trench is connected with the via hole, forming a dummy contact hole separated from the via hole by sequentially etching the upper porous oxide layer and the pyrolytic polymer layer, forming metal interconnections by filling the via hole and the trench with a metal thin film, forming a dummy interconnection by filling the dummy contact hole with a metal thin film, and forming a vacuum between the upper and lower porous oxide layers by removing the pyrolytic polymer layer.

BRIEF DESCRIPTION OF THE DRAWINGS

FIG. 5 is an example sectional view illustrating a semiconductor device according to embodiments;

DETAILED DESCRIPTION

Figure 5:
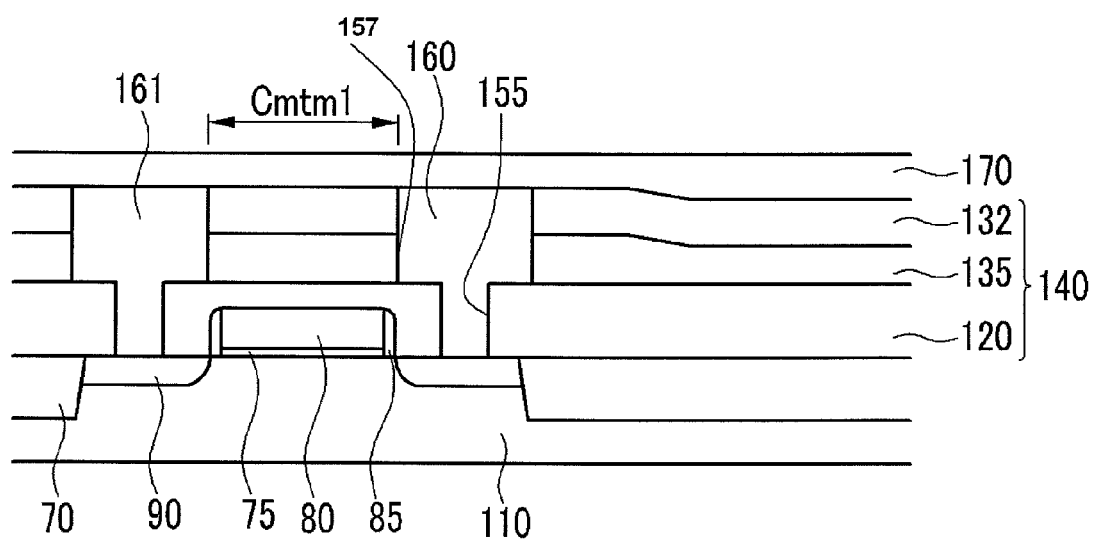

Referring to FIG. 5, according to embodiments, a semiconductor device may include lower porous oxide layer 120, that may include via hole 155. Lower porous oxide layer 120 may be formed on semiconductor substrate 110 that may have a conductive layer. Upper porous oxide layer 132 may include trench 157 connected with via hole 155, and may be formed on lower porous oxide layer 120 by interposing vacuum space 135 therebetween. Vacuum space 135 may be an air layer, in embodiments. Metal interconnections 160 and 161 may be formed in via hole 155 and trench 157, respectively.

According to embodiments, a semiconductor device may include diffusion barrier layer 170 formed on metal interconnections 160 and 161 and upper porous oxide layer 132.

According to embodiments, a pyrolytic polymer existing between upper and lower porous oxide layers 132 and 120 may be removed, so that an inter-metal dielectric layer may have a dielectric constant (k) of about 1. Thus, parasitic capacitance existing between adjacent metal interconnections 160 and 161 or between upper and lower metal interconnections may be reduced and/or minimized, and an operational speed of the semiconductor device may be improved.

Hereinafter, a method for manufacturing the semiconductor device according to embodiments will be described.

FIGS. 1 to 5 are example sectional views illustrating a manufacturing processes for a semiconductor device according to embodiments.

Figure 1:
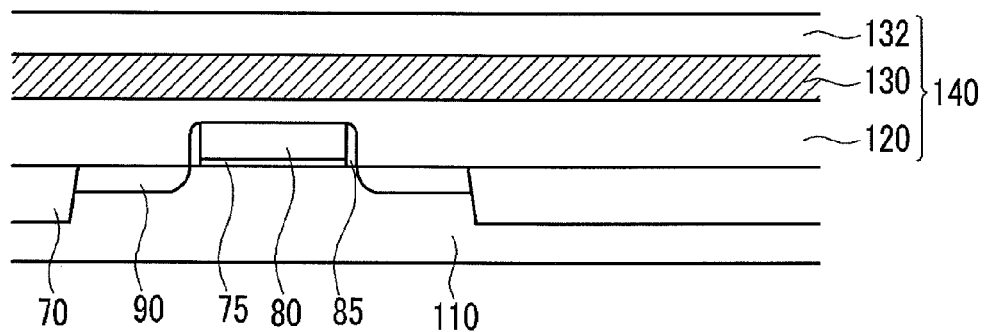
FIGS. 1-5 are example sectional views illustrating a manufacturing processes for a semiconductor device according to embodiments.

Referring to FIG. 1, gate insulating layer 75 and gate electrode 80 may be formed on semiconductor substrate 110, that may include shallow trench isolation (STI) 70 and high-density junction area 90.

Spacers 85 may be formed at sidewalls of gate insulating layer 75 and gate electrode 80, and lower inter-metal dielectric layer 140 may be formed on semiconductor substrate 110, gate electrode 80, and spacer 85.

Lower inter-metal dielectric layer 140 may include first porous oxide layer 120, first pyrolytic polymer layer 130, and second porous oxide layer 132, which may be formed on an entire surface of semiconductor substrate 110.

First and second porous oxide layers 120 and 132 may be formed by heating oxide layers including carbon (C) such that the carbon is emitted from the oxide layers. First and second porous oxide layers 120 and 132 may have a plurality of holes. Since first and second porous oxide layers 120 and 132 may have a plurality of holes therein, capacitance may be minimized and an operational speed of a semiconductor device may be improved.

In addition, first pyrolytic polymer layer 130 may include polyethylene glycol, or polyetheresteramide copolymer.

Figure 2:
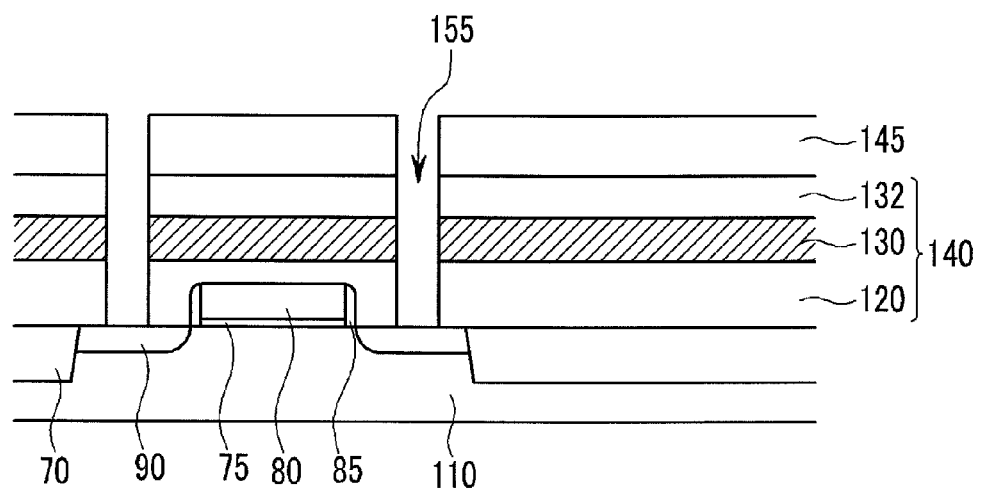

Referring to FIG. 2, lower via hole pattern 145 may be formed on second porous oxide layer 132, for example by using a photoresist film, and second porous oxide layer 132, first pyrolytic polymer layer 130, and first porous oxide layer 120 may be selectively etched, for example by using the lower via hole pattern 145 as an etch mask, thereby forming lower via hole 155.

Figure 3:
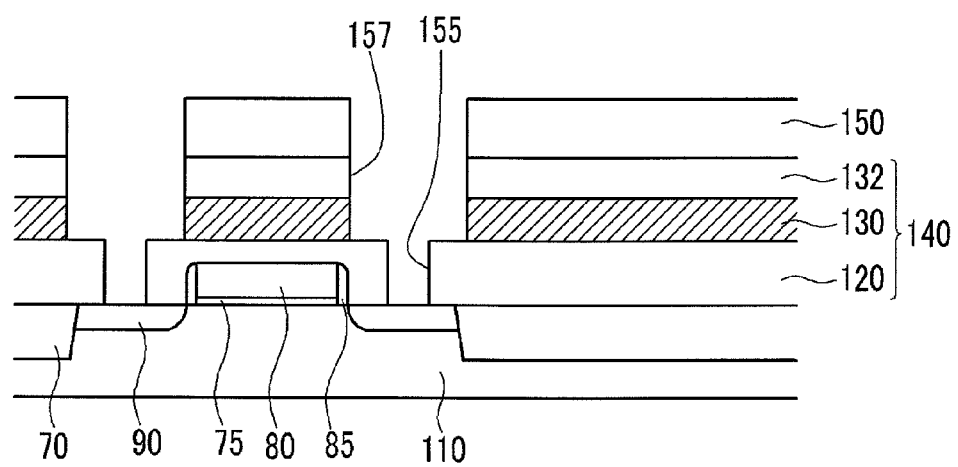

Referring to FIG. 3, lower via hole pattern 145 may be removed, and lower trench pattern 150 may be formed on second porous oxide layer 132. Then, second porous oxide layer 132 and pyrolytic polymer layer 130 may be sequentially etched by using lower trench pattern 150 as an etch mask, thereby forming lower trench 157 connected to lower via hole 155.

Second porous oxide layer 132 and pyrolytic polymer layer 130 may be etched using different etchants, and the first oxide layer 120 may serve as an etch stop point when pyrolytic polymer layer 130 is etched.

Figure 4:
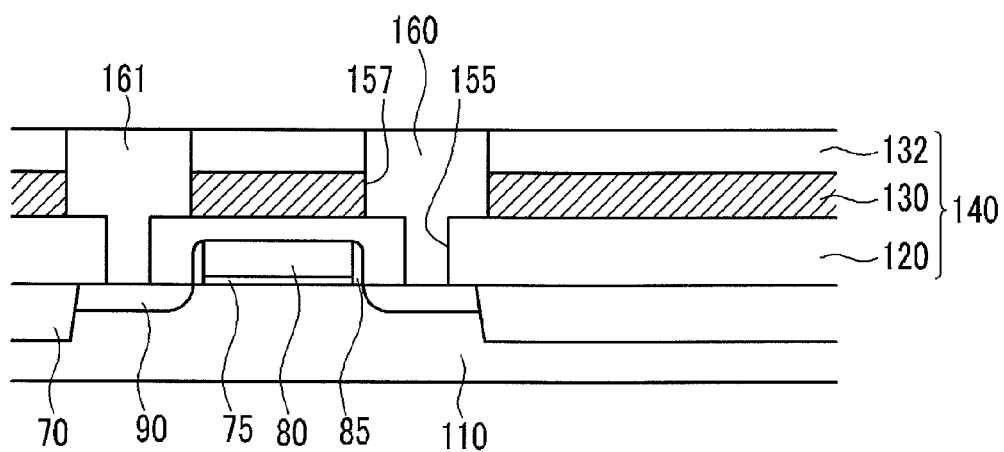

Referring to FIG. 4, lower trench pattern 150 may be removed, and a metal, such as copper for example, may be filled in lower via hole 155 and lower trench 157. In this state, a CMP (chemical mechanical polishing) process may be performed with respect to the resultant structure, thereby forming first and second lower metal interconnections 160 and 161.

Referring to FIG. 5, a heat-treatment process may be performed with respect to semiconductor substrate 110, thereby removing pyrolytic polymer layer 130. Accordingly, lower vacuum space 135, for example having a dielectric constant of about 1, may be formed. In the embodiments, a heat-treatment process may be carried out for approximately 1 to 2 hours at a temperature of approximately 400° C. to 500° C.

According to embodiments, semiconductor substrate 110 having lower metal interconnections 160 and 161 is subjected to a heat-treatment process for 1 hour and 30 minutes at a temperature of approximately 450° C. In this manner, pyrolytic polymer layer 130 may be effectively removed.

If the heat-treatment temperature is less than 400° C., pyrolytic polymer may not be thermally decomposed. If the heat-treatment temperature exceeds 500° C., pyrolytic polymer may not be thermally decomposed, but may be hardened. If the heat-treatment time is less than 1 hour, pyrolytic polymer may be insufficiently decomposed. If the heat-treatment time exceeds 2 hours, the semiconductor substrate may be excessively heated, and other elements, such as transistors, may be decomposed and/or damaged together with pyrolytic polymer.

In embodiments, pyrolytic polymer layer 130 may be removed in the nitrogen ($N_2$) atmosphere or vacuum atmosphere.

In embodiments, since lower vacuum space 135 may be formed between adjacent lower metal interconnections 160 and 161, the parasitic capacitance Cmtm1 may be minimized. An operational speed of a semiconductor device may thereby be improved.

In addition, in embodiments, since lower vacuum space 135 may be aligned between first and second porous oxide layers 120 and 132, diffusion barrier 170, which may have a planar structure, may be provided to prevent a region, where lower metal interconnections 160 and 161 are not formed, from being biased downward by the tare thereof while preventing diffusion of lower metal interconnections 160 and 161. In embodiments, diffusion barrier 170 may include SiN, SiC, SiOC or SiON.

According to embodiments, pyrolytic polymer existing between the upper and lower porous oxide layers 132 and 120 may be removed, so that an inter-metal dielectric layer may have a dielectric constant (k) of about 1. Thus, parasitic capacitance existing between adjacent metal interconnections 160 and 161 or between upper and lower metal interconnections may be minimized. An operational speed of a semiconductor device may thus be improved.

In addition, according to embodiments, the inter-metal dielectric layer may include a porous oxide layer, so that a plurality of holes may be formed in the inter-metal dielectric layer. Thus, the capacitance may be minimized, and an operational speed of the semiconductor device may be improved.

Figure 8:
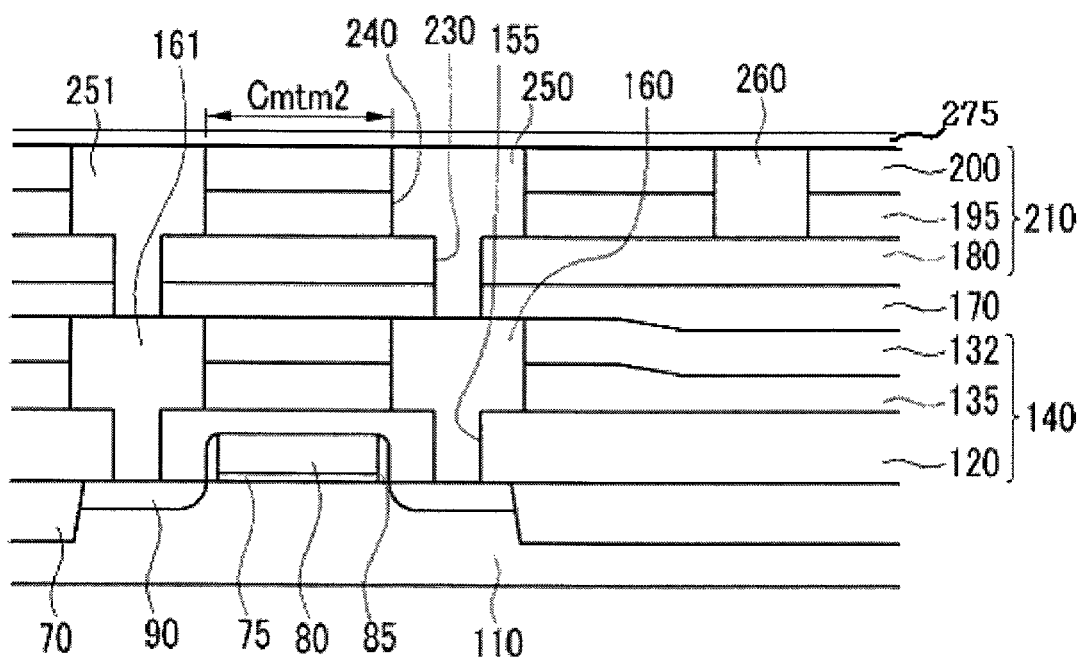
FIG. 8 is an example sectional view illustrating a semiconductor device according to embodiments.

FIG. 8 is an example sectional view illustrating a semiconductor device according to embodiments. According to embodiments, a semiconductor device may include lower porous oxide layer 180 including via hole 230 and may be formed on a semiconductor substrate 110 having a conductive layer. Upper porous oxide layer 200 may include trench 240 that may connect with the via hole 230. Upper porous oxide layer 200 may be formed on lower porous oxide layer 180 by interposing an air and/or vacuum layer 195 therebetween. Metal interconnections 250 and 251 may be formed in via hole 230 and trench 240, respectively. Dummy interconnection 260 may be formed on upper porous oxide layer 200 while being separated from metal interconnections 250 and 251.

According to embodiments, a pyrolytic polymer that may exist between upper and lower porous oxide layers 200 and 180 may be removed, so that an inter-metal dielectric layer has a dielectric constant (k) of about 1. Thus, parasitic capacitance existing between adjacent metal interconnections 250 and 251 or between upper and lower metal interconnections may be minimized, and an operational speed of a semiconductor device may be improved.

In addition, according to embodiments, dummy interconnection 260 may prevent a region formed between lower metal interconnections from being biased downward due to the tare thereof.

Hereinafter, a method for manufacturing the semiconductor device according to embodiments will be described.

Figure 6:
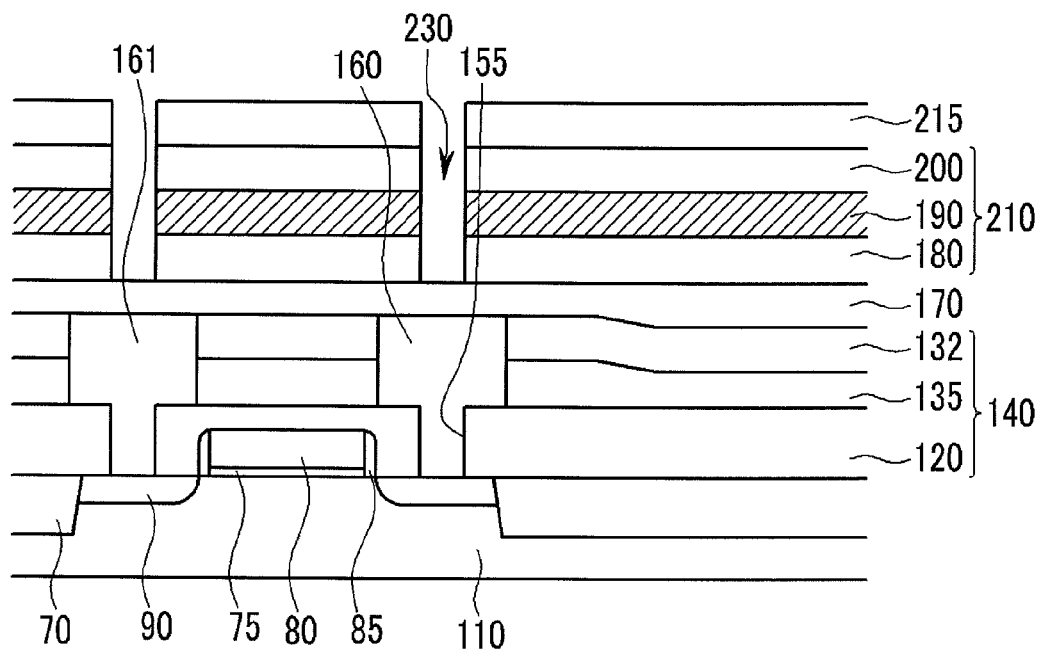
FIGS. 6-7 are example sectional views illustrating a manufacturing processes for a semiconductor device according to embodiments.
Figure 7:
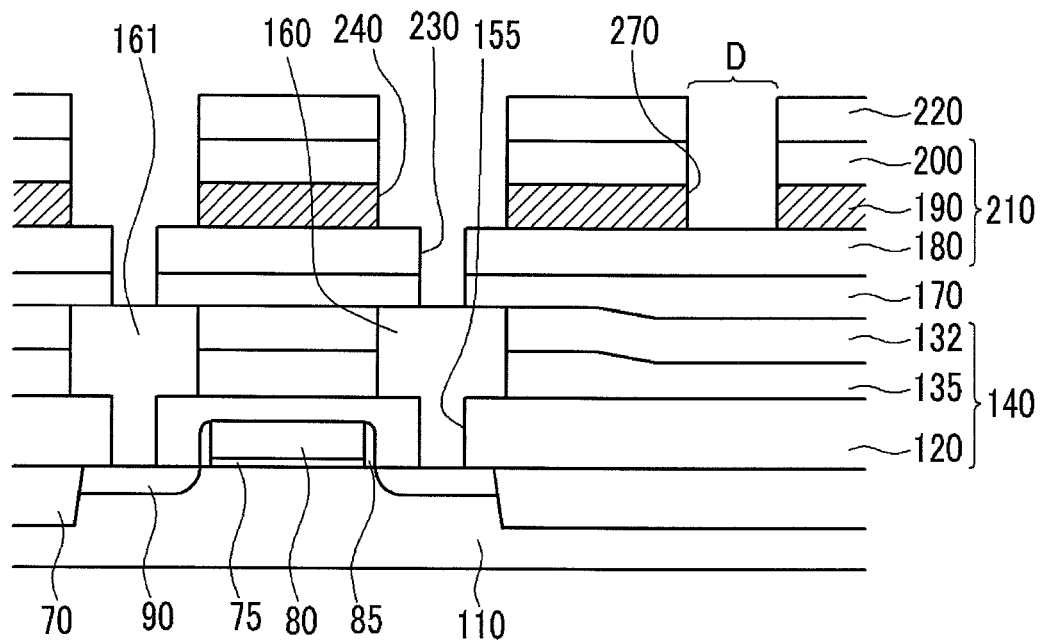

FIGS. 6 to 8 are example sectional views illustrating a manufacturing processes for a semiconductor device according embodiments.

Although a method for manufacturing a semiconductor device according embodiments will be described as the following process, according to embodiments the method may include forming a dummy interconnection after a transistor has been formed.

Referring to FIG. 6, a semiconductor device as described above with respect to FIGS. 1-5 is provided. From there, upper inter-metal dielectric layer 210 may be formed on diffusion barrier 170.

Upper inter-metal dielectric layer 210 may include third porous oxide layer 180, second pyrolytic polymer layer 190, and fourth porous oxide layer 200. Upper inter-metal dielectric layer 210 may be formed on lower diffusion barrier 170. A method for forming third and fourth porous oxide layers 180 and 200 is substantially identical to the method for forming first and second porous oxide layers 120 and 132.

In embodiments, second pyrolytic polymer layer 190 may include polyethylene glycol, or polyetheresteramide copolymer.

In embodiments, upper via hole pattern 215 may be formed on fourth porous oxide layer 200. Fourth porous oxide layer 200, second pyrolytic polymer layer 190, and the third porous oxide layer 180 may be selectively etched using upper via hole pattern 215 as an etch mask. Upper via hole 230 may thus be formed.

Referring to FIG. 7, upper via hole pattern 215 may be removed, and upper trench pattern 220 may be formed on fourth porous oxide layer 200, for example by using a photoresist film. In embodiments, upper trench pattern 220 may have a pattern structure for an area where electric connection to a lower conductive layer is not formed, that is, dummy area D where the metal interconnection may not be formed.

Fourth porous oxide layer 200 and second pyrolytic polymer layer 190 may be etched by using upper trench pattern 220 as an etch mask, and may thereby form upper trench 240 and dummy contact hole 270.

Referring to FIG. 8, upper trench pattern 220 may be removed, and then metallic materials are filled in upper via hole 230, upper trench 240 and dummy contact hole 270. In this state, a CMP (chemical mechanical polishing) process may be performed with respect to the resultant structure, thereby forming upper metal interconnections 250 and 251 and dummy interconnection 260.

Similar to diffusion barrier 170, dummy interconnection 260 may prevent a region between lower metal interconnections 160 and 161 from being biased downward due to the tare thereof.

A heat-treatment process may be performed with respect to an entire surface of semiconductor substrate 110, thereby removing second pyrolytic polymer layer 190. Accordingly, an upper vacuum space 195 having a dielectric constant (k) of about 1 may be formed.

In embodiments, the heat-treatment process may be carried out for approximately 1 to 2 hours at a temperature of approximately 400° C. to 500° C. In addition, second pyrolytic polymer layer 190 may be removed in a nitrogen ($N_2$) atmosphere or vacuum atmosphere.

Upper diffusion barrier 275 may be formed on fourth porous oxide layer 200, upper metal interconnections 250 and 251, and dummy interconnection 260. In embodiments, a planarization process may be performed with respect to upper diffusion barrier 275. Upper diffusion barrier 270 may include SiN, SiC, SiOC or SiON, according to embodiments.

Upper diffusion barrier 275 may be aligned in vacuum space 195 formed between third and fourth porous oxide layers 180 and 200, and may prevent the region where upper metal interconnections 250 and 251 are not formed from being biased downward due to the tare thereof while preventing diffusion of upper metal interconnections 250 and 251.

According to embodiments, the dielectric member that may cause the parasitic capacitance at an area between adjacent upper metal interconnections 250 and 252 may include the upper vacuum space 195 and third and fourth oxide layers 180 and 200 representing the dielectric constant lower than that of a related art dielectric member. Hence, the parasitic capacitance Cmtm2 may be reduced and/or minimized. Thus, an operational speed of the semiconductor device may be improved.

In addition, according to embodiments, first and third porous oxide layers 120 and 180 may be aligned between lower metal interconnections 160 and 161 and upper metal interconnections 250 and 251, so that the parasitic capacitance can be reduced.

Furthermore, according to embodiments, the dummy interconnection and the diffusion barrier may be provided, and may prevent the region formed between the lower metal interconnections and the region formed between the upper metal interconnections from being biased downward due to the tare thereof.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
   a lower porous oxide layer formed over a semiconductor substrate having a conductive layer, the lower porous oxide layer including a via hole;
   a vacuum layer formed over the lower porous oxide layer, the vacuum layer including a bottom portion of a trench coupled with the via hole;
   an upper porous oxide layer formed over the lower porous oxide layer by interposing the vacuum layer between the lower porous oxide layer and the upper porous oxide layer, the upper porous oxide layer including a top portion of the trench coupled with the via hole, wherein the trench has a width larger than a width of the via hole such that the trench is connected with the via hole; and
   a metal interconnection formed in the via hole and the trench, respectively, wherein the vacuum layer directly physically contacting sidewall portions of the metal interconnection in the bottom portion of the trench, bottom surfaces of the upper porous oxide layer, and top surfaces of the lower porous oxide layer.

2. The device of claim 1, further comprising a diffusion barrier formed over the metal interconnection and the upper porous oxide layer.

3. The device of claim 1, further comprising a dummy interconnection formed over the upper porous oxide layer.

4. The device of claim 1, wherein the metal interconnection fills the via hole and the trench with a metal thin film.

5. The device of claim 1, wherein the lower porous oxide layer comprises an etch stop for forming the trench.

6. The device of claim 1, wherein the lower porous oxide layer comprises a plurality of holes therein.

7. The device of claim 1, wherein the upper porous oxide layer comprises a plurality of holes therein.

8. The device of claim 2, wherein the diffusion barrier comprises a planar structure.

9. The device of claim 2, wherein the diffusion barrier comprises at least one of SiN, SiC, SiOC or SiON.

10. The device of claim 3, wherein the dummy interconnection is formed on the upper porous oxide layer while being separated from the metal interconnections.

11. The device of claim 1, wherein the vacuum layer is formed from a pyrolytic polymer layer formed over the lower porous oxide layer by performing a heat-treatment process with respect to a surface of the semiconductor substrate so that the pyrolytic polymer layer is removed.

12. The device of claim 11, wherein the heat-treatment process is performed for 1 to 2 hours at a temperature of 400° C. to 500° C.

13. The device of claim 11, wherein the pyrolytic polymer layer is removed using nitrogen ($N_2$) gas.

14. The device of claim 11, wherein the pyrolytic polymer layer is removed in a vacuum atmosphere.

\* \* \* \* \*